US007019543B2

(12) United States Patent
Quon

(10) Patent No.: US 7,019,543 B2

(45) Date of Patent: Mar. 28, 2006

(54) IMPEDANCE MONITORING SYSTEM AND METHOD

(75) Inventor: Bill H. Quon, Brea, CA (US)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 10/469,986

(22) PCT Filed: Mar. 14, 2002

(86) PCT No.: PCT/US02/05112

§ 371 (c)(1),
(2), (4) Date: Feb. 17, 2004

(87) PCT Pub. No.: WO02/075332

PCT Pub. Date: Sep. 26, 2002

(65) Prior Publication Data

US 2004/0135590 A1 Jul. 15, 2004

Related U.S. Application Data

(60) Provisional application No. 60/276,106, filed on Mar. 16, 2001.

(51) Int. Cl.
*G01R 27/08* (2006.01)
*G01N 27/62* (2006.01)

(52) U.S. Cl. .................................... 324/713; 324/464

(58) Field of Classification Search ................ 324/464, 324/467, 468, 459, 713; 315/111.21, 111.31; 219/61, 67–72

See application file for complete search history.

(56) References Cited

U.S. PATENT DOCUMENTS

| | | | | |
|---|---|---|---|---|
| 4,316,791 A | | 2/1982 | Taillet | 204/298.32 |
| 4,990,859 A | * | 2/1991 | Bouyer et al. | 324/649 |
| 5,140,223 A | * | 8/1992 | Gesche et al. | 315/111.21 |
| 5,539,303 A | * | 7/1996 | Okazako et al. | 324/71.1 |
| 5,939,886 A | * | 8/1999 | Turner et al. | 324/464 |
| 6,027,601 A | * | 2/2000 | Hanawa | 156/345.28 |
| 6,174,450 B1 | * | 1/2001 | Patrick et al. | 216/61 |
| 6,184,623 B1 | | 2/2001 | Sugai et al. | 315/111.21 |
| 6,351,683 B1 | | 2/2002 | Johnson et al. | 700/121 |
| 6,444,084 B1 | * | 9/2002 | Collins | 118/723 I |
| 2005/0083065 A1 | * | 4/2005 | Zhang et al. | 324/464 |

* cited by examiner

*Primary Examiner*—Anjan Deb
(74) *Attorney, Agent, or Firm*—Oblon, Spivak, McClelland, Maier & Neustadt, P.C.

(57) ABSTRACT

An apparatus (14) for and method of measuring impedance in a capacitively coupled plasma reactor system (10). The apparatus includes a high-frequency RF source (150) in electrical communication with an upper electrode (50). A first high-pass filter (130) is arranged between the upper electrode and the high-frequency RF source, to block low-frequency, high-voltage signals from the electrode RF power source (66) from passing through to the impedance measuring circuit A current-voltage probe (140) is arranged between the high-frequency source and the high-pass filter, and is used to measure the current and voltage of the probe signal with and without the plasma present. An amplifier (250) is electrically connected to the current-voltage probe, and a data acquisition unit (260) is electrically connected to the amplifier. A second high-pass filter (276) is electrically connected to a lower electrode (56) and to ground, so as to complete the isolation of the high-frequency circuit of the impedance measurement apparatus from the low-frequency, high-voltage circuit of the capacitively coupled plasma reactor system. A method of measuring the plasma impedance using the apparatus of the present invention is also disclosed.

27 Claims, 5 Drawing Sheets

IMPEDANCE MONITORING SYSTEM AND METHOD

CROSS-REFERENCE TO RELATED APPLICATIONS

This application claims priority to International Application No. PCT/US02/05112, filed on Mar. 14, 2002; which claims priority to U.S. Provisional Application Ser. No. 60/276,106, filed Mar. 16, 2001. The entire contents of these applications is incorporated herein by reference.

BACKGROUND OF THE INVENTION

1. Field of the Invention

The present invention relates to plasma reactor systems, and in particular relates to a method of and system for monitoring the impedance in a parallel-plate plasma reactor system.

2. Discussion of the Background

Ionized gas or "plasma" may be used during processing and fabrication of substrates (e.g., semiconductor devices, flat panel displays and other products requiring etching or deposition of materials). Plasma may be used to etch or remove material from or sputter or deposit material onto a semiconducting, conducting or insulating surface. Creating a plasma for use in manufacturing or fabrication processes typically is done by introducing a low-pressure process gas into a chamber surrounding a substrate that resides on a substrate support member, more commonly referred to as a "chuck."

In a capacitively coupled plasma reactor system, an electrode connected to an RF power source resides above the chuck. The molecules of the low-pressure gas in the chamber are ionized into a plasma by activating the radio frequency energy (power) source and heating electrons once the gas molecules enter the chamber. The plasma then flows over and interacts with the substrate, which is typically biased by providing RF power to the chuck supporting the substrate. In this regard, the chuck serves as the lower electrode, and is sometimes referred to as a "chuck electrode." The plasma gas flowing over the chuck is removed by a vacuum system connected to the chamber.

One of the key factors that determines the yield and overall quality of the plasma processing is the uniformity of the plasma process at the surface of the substrate. In a capacitively coupled plasma reactor, the process uniformity is affected by the design of the overall system, and in particular by the physical relationship of the upper electrode, the chuck, the plasma generation source, and the radio frequency (RF) tuning electronics. Improvements that lead to the ability to control reactor process uniformity are critical to manufacturers of plasma reactors and are the focus of significant efforts.

The ability to control plasma process parameters in a capacitively coupled plasma reactor depends to a large degree on the proper measurement of the plasma conditions. The plasma parameters, including the plasma density, the electron temperature, the impinging ion energy distribution, etc., must be monitored to produce reliable process results for advanced plasma processing systems. Those parameters are normally termed as internal parameters. Internal parameters can be monitored and used as a feedback to vary the external control process parameters ("system control parameters"), such as RF power, gas flow rate, gas pressure, the RF power and frequency, DC bias, etch chemistries, etch time, electrode spacing, wafer placement, and the like.

Because of the problem of plasma disturbance and contamination introduced by some plasma measurement techniques, only non-intrusive plasma monitors are used in the semi-conductor processing industries. There are presently several different non-intrusive techniques available to measure plasma properties. One such technique is optical emission spectroscopy, wherein light emitted by the plasma is collected and spectrally analyzed to extract the plasma properties. However, this technique has some serious shortcomings, such as low measurement reproducibility of emission line intensity, and lens degradation.

Another technique involves monitoring the RF voltage and current on the electrodes. The relative phase difference can resolve the real system impedance and provide useful information about the plasma parameters. However, this technique is often hindered by the small phase difference involved in the measurement. The substrate and the electrodes contribute a large fraction to the real system impedance, while the plasma impedance is usually only a small perturbation (<10%) of the total system impedance. Even with this limitation, these RF monitors are still used widely in semiconductor manufacturing, as well as by the equipment tool manufacturers in advanced process control (APC) systems.

Some plasma parameter measurement attempts have been made in APC systems by correlating the passive RF measurements with certain process parameters, such as the so-called equipment footprint, the etch or deposition rate, the end-point of the pattern etch, process clean end-point, etc., to deduce the control functions or traces and establish a correlation with the level change in the discharge impedance measured by the passive RF measurements. However, this correlation method requires a large number of measurements for every individual system to obtain statistically averaged plasma characteristics.

There are other problems with known plasma measuring techniques. For example, certain passive conventional monitoring techniques involve measuring the current and voltage of the RF power provided to the upper electrode to form the plasma. However, this technique is problematic because the plasma reacts to the RF power signal, which can result in a change of the plasma state. Other techniques involve the use of fundamental and harmonics signals produced in the plasma to detect the state of the plasma. However, it can be difficult to obtain meaningful measurements when noise interferes with the low-amplitude RF signals.

Further, in most plasma monitoring methods, the impedance of the plasma is determined by measuring the current, voltage and the phase difference between the two at the fundamental frequency (or the first few harmonics) of the RF power source. The impedance contains both imaginary and real parts. The real part is related to the resistance R associated with the circuit itself (called the circuit resistance) and of the plasma (called the "plasma resistance"). The imaginary part of the system impedance is due primarily to the capacitance C of the plasma sheaths near the electrodes, particularly for frequencies less than the plasma discharge resonance (when the plasma impedance is purely resistive); below which the plasma is capacitive in nature and above which the plasma is inductive in nature. Therefore, at the low harmonics (i.e. $2^{nd}$, $3^{rd}$, . . . ), the complex system impedance is approximated by $Z=1/j\omega C+R$, with $1/\omega C>>R$. Therein, the resistance R mostly comprises circuit resistance. Thus, it is usually rather difficult to determine the real part of the system impedance due to the large phase angle or nearly singular argument, and the difficulty of measuring thereof. Moreover, the difficulty of extracting a small plasma resistance from a relatively large circuit resistance further exacerbates the problem.

BRIEF SUMMARY OF THE INVENTION

The present invention relates to plasma reactor systems, and in particular relates to a method of and system for monitoring the impedance in a parallel-plate plasma reactor system.

A first aspect of the invention is an apparatus for measuring impedance in a capacitively coupled plasma reactor system having an upper and lower electrode capable of forming a plasma therebetween. The apparatus includes a high-frequency RF source in electrical communication with the upper electrode. The high frequency source is capable of generating an electrical probe signal of a frequency higher than the fundamental frequency used to form the plasma in the reactor system. A first high-pass filter is arranged between the upper electrode and the high-frequency RF source. The role of the first high-pass filter is to block low-frequency, high-voltage electrical signals from the upper electrode RF power supply from passing into the circuit for the impedance measurement apparatus. A current-voltage (IV) probe is arranged between the high-frequency source and the high-pass filter, and is used to measure the current and voltage of the probe signal with and without the plasma present. An amplifier is electrically connected to the current-voltage probe, and is preferably a lock-in amplifier that locks onto a modulated probe signal so as to increase the signal-to-noise ratio. A data acquisition unit, such as an analog-to-digital converter, is electrically connected to the amplifier and stores the analog current and voltage signals in digital form. A second high-pass filter is electrically connected to the lower electrode and to ground, so as to isolate the high-frequency circuit of the impedance measurement apparatus from the low-frequency, high-voltage circuit of the capacitively coupled plasma reactor system.

A second aspect of the invention is a method for measuring the impedance in a capacitively coupled plasma processing system having an upper and lower electrode. The method includes the step of transmitting a high-frequency probe signal to the upper electrode through an electrical line connected to the upper electrode. This step is performed when there is no plasma formed between the electrodes. The next step is then measuring, in the electrical line, a first current and a first voltage of the probe signal. The next step involves calculating a "no plasma present" impedance $Z_{np}$ based on the first current and the first voltage measurements. Once these measurements and calculations are performed, the next step involves forming a plasma between the upper and lower electrodes. The next step is then measuring a second current and a second voltage of the probe signal passing to the upper electrode through said electrical line. The next step involves calculating a system impedance $Z_{sys}$ from the second current and second voltage measurements. The next step involves determining a sheath resistance of the plasma $Z_{sheath}$, preferably through the use of a standard model. The last step is then calculating the plasma impedance from the relation $Z_{plasma}=Z_{sys}-Z_{np}-Z_{sheath}$.

DESCRIPTION OF THE PREFERRED EMBODIMENTS

The present invention relates to plasma reactor systems, and in particular relates to a method of and system for monitoring the impedance in a parallel-plate plasma reactor system.

Figure 1:
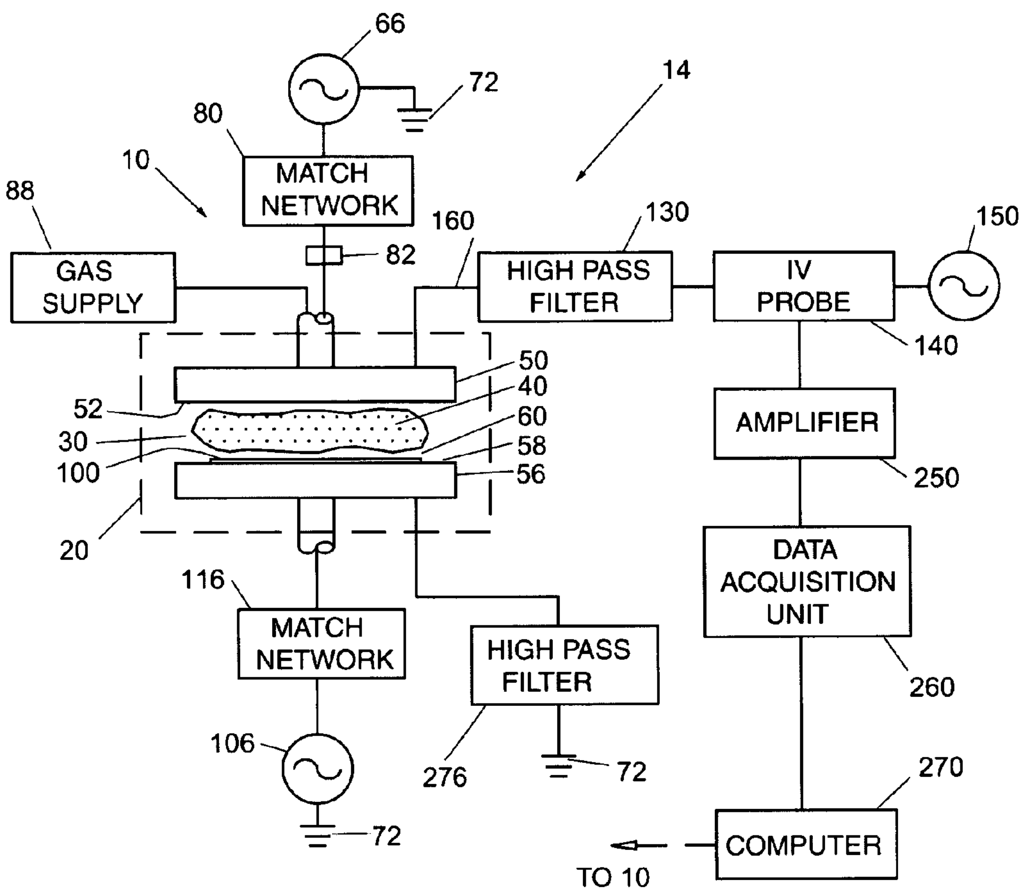
FIG. 1 is a schematic cross-sectional diagram of a capacitively coupled plasma system (CC system) with the impedance measuring apparatus of the present invention electrically connected thereto.

With reference now to FIG. 1, there is shown a capacitively coupled plasma reactor system (hereinafter, "CC system") 10 to which is attached an impedance measurement system 14 of the present invention. CC system 10 comprises a reactor chamber 20 having an interior region 30 capable of containing a plasma 40. CC system 10 includes a planar upper electrode 50 with a lower surface 52 and an opposing planar lower electrode 56 with an upper surface 58, thereby defining parallel plate electrodes with a space 60 therebetween in which plasma 40 is formed. Upper electrode 50 is electrically connected to an upper electrode RF power source 66, which is electrically connected to ground 72. An upper electrode match network 80 is arranged between upper electrode 50 and upper electrode RF power source 66. Furthermore, a voltage-current (VI) probe 82 is located in the transmission line between the output of the match network 80 and the upper electrode 50 in order to monitor the voltage amplitude at the fundamental RF frequency of the RF generator 66. In pneumatic communication with interior region 30 (e.g., through upper electrode 50, as shown) is a gas supply system 88 that provides an ionizable gas (e.g., Argon) for the formation of plasma 40.

Upper surface 58 of lower electrode 56 is capable of supporting a substrate 100 (e.g., a semiconductor wafer, an LCD panel or other devices) to be processed by plasma 40. Lower electrode 56 is electrically connected to a lower electrode RF power source 106, which is connected to ground 72. A lower electrode match network 116 is arranged between lower electrode 56 and lower electrode RF power source 106. Substrate 100 is in electrical contact with lower electrode 56 and is thus electrically part of the lower electrode.

With continuing reference to FIG. 1, impedance measurement system 14 includes a first high-pass filter 130 electrically connected to upper electrode 50, a current-voltage ("IV") probe 140 electrically connected to the high-pass filter 130, and a high-frequency RF source 150 electrically connected to the IV probe 140. The purpose of high-pass filter 130 is to prevent a high-voltage (e.g., 1000V) low-frequency (e.g., 13.5 to 60 MHz) electrical signal generated by upper electrode RF power source 66 from passing through to IV probe 140 and the other components of system 14.

Figure 2:
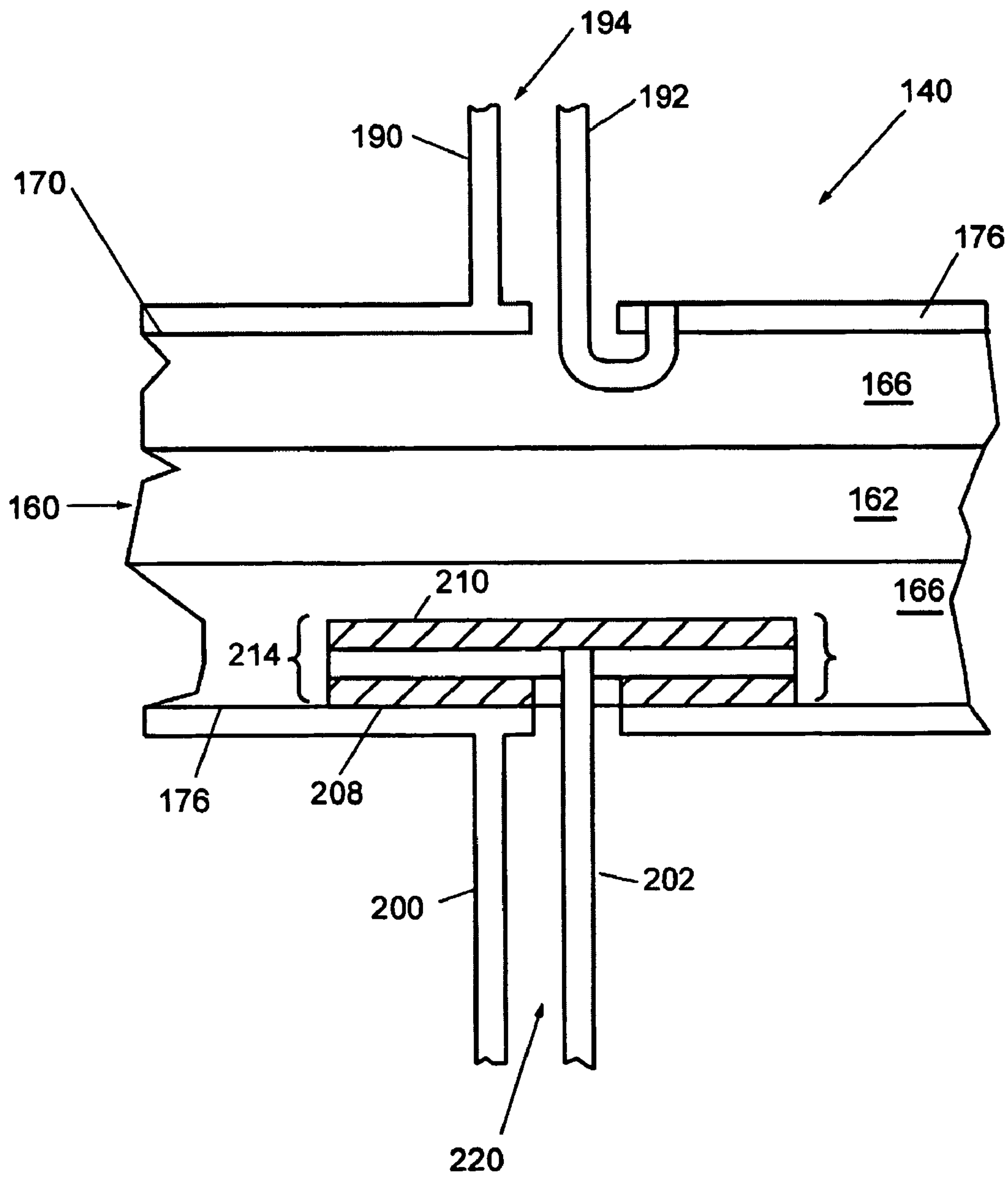
FIG. 2 is a close-up schematic cross-sectional diagram of a portion of the coaxial cable connecting the high-pass filter to the high-frequency signal generator, which includes formed therein the high-frequency IV probe of FIG. 1.

With reference now to FIG. 2, IV probe 140 is preferably formed in a relatively thick (e.g., 1" to 1.5" diameter) coaxial transmission line (e.g., a 50Ω line) 160 that electrically connects high pass filter 130, high-frequency signal generator 150 and upper electrode 50. Line 160 includes an inner conducting wire 162 surrounded by an insulating layer 166 having an outer surface 170. Surrounding outer surface 170 is an outer conductor layer 176. A second insulating layer (not shown) surrounding outer conductor layer 176 is typically provided to shield the line. IV probe 140 is formed in line 160 by electrically connecting a first pair of conducting leads 190 and 192 in series to the outer conductor layer 176 thereby forming a current terminal 194 at which the current passing through line 160 can be measured.

IV probe 140 further includes a second pair of conducting leads 200 and 202 respectively connected to plates 208 and 210 of a capacitor 214 formed within a portion of insulating layer 166 immediately adjacent outer conductor layer 176. Capacitor 214 electrically connects in parallel outer conductor layer 176 to leads 200 and 202, thereby forming a voltage terminal 220 at which the voltage passing through line 160 can be measured.

The current terminal 194 and the voltage terminal 220 for the IV probe in transmission line 160 are designed to facilitate the use of a high impedance RF monitor, which may be, for example, a Tektronix P6245 1.5 GHz 10X Active Probe manufactured by Tektronix; the output of which may serve as the input to amplifier 250. For further details, the construction of the IV probe is described in pending U.S. application 60/259,862, entitled ‘Capacitively coupled RF voltage probe’ (filed on Jan. 8, 2001), which is incorporated herein by reference in its entirety.

With reference again to FIG. 1, system 14 further includes an amplifier 250 electrically connected to IV probe 140. Amplifier 250 may be a lock-in amplifier to improve the signal-to-noise ratio. System 14 also includes a data acquisition unit 260 electrically connected to amplifier 250. Data acquisition unit 260 is adapted to receive the analog signals from amplifier 250 and convert them to digital signals and store them in digital form. In a preferred embodiment, data acquisition unit 260 is an analog-to-digital converter with a memory. Also included in system 14 is a process control computer 270 electrically connected to the data acquisition unit. Computer 270 receives the digital signals from data acquisition unit 260 and processes the signals so as to perform the necessary calculations for determining the plasma impedance, as described below. Computer system 270 is preferably in electrical communication with CC system 10 and the various systems and sourced therein, so as to be able to control and adjust one or more of the system control parameters while processing substrate 100. Computer 270 may, in fact, be the control computer for system 10.

Impedance measurement system 14 also includes a second high-pass filter 276 electrically connected to lower electrode 56 and to ground 72. In the case where only a single frequency probe signal is used, high-pass filter 276 may include a reactive ground circuit designed for the single-frequency probe signal.

In the arrangement of CC system 10 in combination with impedance measurement system 14 shown in FIG. 1, there are two main RF circuits: one is a low-frequency (e.g., 13.56 MHz or 60 MHz) circuit associated with system 14 and extends from upper electrode RF power source 66 to lower RF power source 106 and to ground 72 (or from upper electrode RF power source 66 through lower electrode and to ground via a narrow band filter (low impedance path to ground) designed specifically for the low-frequency power applied to the upper electrode). The other is a parallel high frequency (e.g., several hundred MHz) circuit associated with impedance monitoring measurement system 14. The role of high-pass filters 130 and 276 is to isolate the high-frequency circuit from the low-frequency circuit. The elements common to the low- and high-frequency circuits are upper and lower electrodes 50 and 56 (including space 60 therebetween) and substrate 100. Space 60 may contain either a substantial vacuum or plasma 40.

Theory of Operation

By isolating the high-frequency impedance measurement circuit of system 14 from the low-frequency circuit associated with CC system 10, the plasma impedance of the CC system can be accurately measured. In the present invention, the necessary isolation is accomplished by grounding the lower (chuck) electrode 56 via high-pass filter 276 and passing a measuring (probe) signal from high-frequency RF source 150 to the upper electrode 50, while blocking with high-pass filter 130 the high-voltage low-frequency signal (and its harmonics generated by the interaction with plasma 40) from CC system 10. Because the plasma is generated and sustained at a much lower frequency (e.g., 13.5 MHz to 60 MHz) than the measuring frequency (e.g., 150 MHz to 600 MHz range), the isolating circuitry appears to have a very high capacitive impedance, and thus will not affect plasma 40.

The probe signal frequency is preferably located in between the adjacent high harmonics of the RF signal provided by upper electrode RF power source 66 (e.g., between the $i^{th}$ and the $(i+1)^{th}$ harmonics, where for example i=10), so that the probe signal is far away from the fundamental and plasma-induced harmonic levels. In addition, synchronized detection of the probe signal (e.g., by modulating the probe signal) can be used with active measurements to increase the signal-to-noise ratio by orders of magnitude.

The complex impedance of CC system 10 is generally represented by the relation:

$$Z=j(\omega L-1/\omega C)+R,$$

wherein ω is the angular frequency, C is the total series capacitance, L is the series inductance, R is the resistance, and $j=(-1)^{1/2}$. For example, the capacitance C is due mainly to the plasma sheath capacitance, approximated by $C_{sheath}\approx\epsilon_o A/d_s\approx 200$ pf for systems capable of processing workpieces 200 mm in diameter. A is the surface area of the parallel plates (i.e., electrodes 50 and 56) and $d_s=\lambda_D(2V_o/T)^{1/2}$ is the thickness of the plasma sheath, where $\lambda_D$ is the Debye length. The inductance of the plasma is suitably approximated by $L\approx\omega_{pe}^{-2}C_o^{-1}\approx 250$ pH, where $\omega_{pe}$ is the plasma frequency defined by $\omega_{pe}^2=(en_e/\epsilon_o m)$, $C_o=\epsilon_o A/d$ is the vacuum capacitance, and d is the spacing between the parallel plate electrodes. Furthermore, e is the charge of an electron, $n_e$ is the electron number density and $\epsilon_o$ is the permittivity of free space.

For a typical capacitive discharge, at the applied frequency $\omega=2\pi f=3.78\times10^8$ rad/sec (f=60 MHz), the reactive impedance is:

$$X=j[3.78\ 10^8\times250\ 10^{-12}-1/(3.78\ 10^8\times200\ 10^{-12})]=(0.1-13.2)\Omega.$$

The CC system reactance is nearly purely capacitive. In an actual CC system, the serial capacitance usually makes the reactance still larger, e.g., 100Ω. This value is much larger than the CC system resistance, R~1Ω. It would be different if the impedance were measured at a much higher frequency, say, $\omega_m$=3.78×10$^9$ rad/sec (600 MHz); where the reactance becomes, X=[3.78 10$^9$×250 10$^{-12}$−1/(3.78 10$^9$× 200 10$^{-12}$)]=(0.95–1.32)=−0.37Ω, which is almost at resonance. In this case, the voltage and the current are nearly in phase and the CC system impedance is almost entirely real. In general, with a probe signal of frequency $\omega_m$, X=($\omega_m$L−1/$\omega_m$C) R, the CC system impedance can be more accurately measured.

The frequency ω at which the reactive impedance becomes zero, X=($\omega_o$L−1/$\omega_0$C)=0, is known as the geometric resonant frequency of the system. If the frequency of the probe signal generated by high-frequency RF source 150 is chosen to be the resonant frequency, $\omega_m=\omega_o$, then the CC system impedance would be purely resistive. This allows the measurement of the plasma impedance to be done more accurately. In fact, this resonance causes the plasma sheath to oscillate at nearly any external driving voltage, largely enhancing the detectability of the probe signal. However, the resonance frequency depends on the plasma inductance as well as the sheath capacitance and is a function of the plasma density and other CC system parameters. Thus, exciting the probe signal at the exact resonance requires an active signal source with a wide frequency range.

When upper electrode RF power source 66 is turned off, there is no power in the low-frequency circuit. In this instance, CC system 10 is said to be "cold," with no plasma 40 formed in space 60. Thus, the high-frequency circuit impedance is defined by the capacitance C between upper and lower electrodes 50 and 56, and the resistance of the electrodes and workpiece 100, denoted by $R_c$. The measured impedance (i.e., the "no plasma" impedance $Z_{np}$) of the "cold" system 10 is thus given by:

$$Z_{np}=1/j\omega_m C+R_c. \tag{1}$$

When RF power source 66 is turned on and gas is introduced into interior region 30 of chamber 20, plasma 40 is formed in space 60 between upper and lower electrodes 50 and 56. The high-frequency circuit now includes the plasma resistance, $R_p$, the plasma inductance $L_p$, and the sheath capacitance $C_s$, as well as the system resistance $R_c$. Thus, the measured impedance now becomes:

$$Z_{sys}=1/j\omega_m C_s+j\omega_m L_p+R_p+R_c \tag{2}$$

Equations (1) and (2) are used to separate the plasma impedance $Z_{plasma}$ from that of the cold CC system. The system resistance $R_c$ includes resistance from substrate 100, which can decrease during a plasma process such as etching or deposition. On the other hand, the plasma impedance depends on the system control parameters, such as the RF power, gas pressure, gas flow, plasma chemistries, and the geometrical parameters, such as the spacing between upper and lower electrode 50 and 56, and the like.

In the present invention, important information about the properties of plasma 40 are provided by measuring $Z_{np}$ and monitoring $Z_{sys}$ in real time during the operation of CC system 10. On a time scale of seconds or shorter, the system resistance $R_c$ does not change significantly, so that a change in the system impedance $Z_{sys}$ is due mainly to a change in the plasma impedance. The plasma impedance is given by:

$$Z_{plasma}=j\omega_m L_p+R_p=\omega_m L_p(j+\gamma/\omega_m), \tag{3}$$

wherein $\omega_m$ is the applied frequency and γ is the electron-neutral collision frequency. The latter parameter depends on the amount of RF power provided to upper electrode 50 and on the gas pressure in space 60. A mapping between the complex plasma impedance $Z_{plasma}$ and these plasma parameters is generated and processed in process control computer 270.

On a time scale of minutes or longer, the plasma impedance $Z_{plasma}$ can be kept constant with a constant RF power and gas pressure. The change of the system resistance $R_c$ can be obtained from the time-dependent function of $Z_{sys}$ (equation (3)). Particularly, end-point detection for pattern etch, which is sensitive to the decrease of the wafer resistance, and the end-point detection for deposition, which is sensitive to the increase of wafer resistance, can be provided by measuring the system impedance $Z_{sys}$.

As mentioned above, impedance measurement system 14 includes data acquisition unit 260 and computer 270, which allow for scalable control functions to be introduced by means of mapping of the plasma impedance $Z_{plasma}$ to the aforementioned system control parameters (e.g., gas pressure, electrode spacing, RF power (voltage), RF frequency, etc.).

Impedance measurement system 14 is said to be "active" because it generates a probe signal whose voltage and current are a function of the impedance $Z_{sys}$ of CC system 10, and in particular the plasma impedance $Z_{plasma}$. The advantage of an active impedance measurement as compared to a passive one lies in the scalability of the control functions. For example, when the spacing of the electrodes changes, the plasma impedance increases in proportion. Thus, the mapping parameters can be scaled from the measured values for a fixed spacing, without the need for making measurements that correlate the electrode spacing to the mapping parameters, as with prior art passive monitoring systems.

Figure 3:
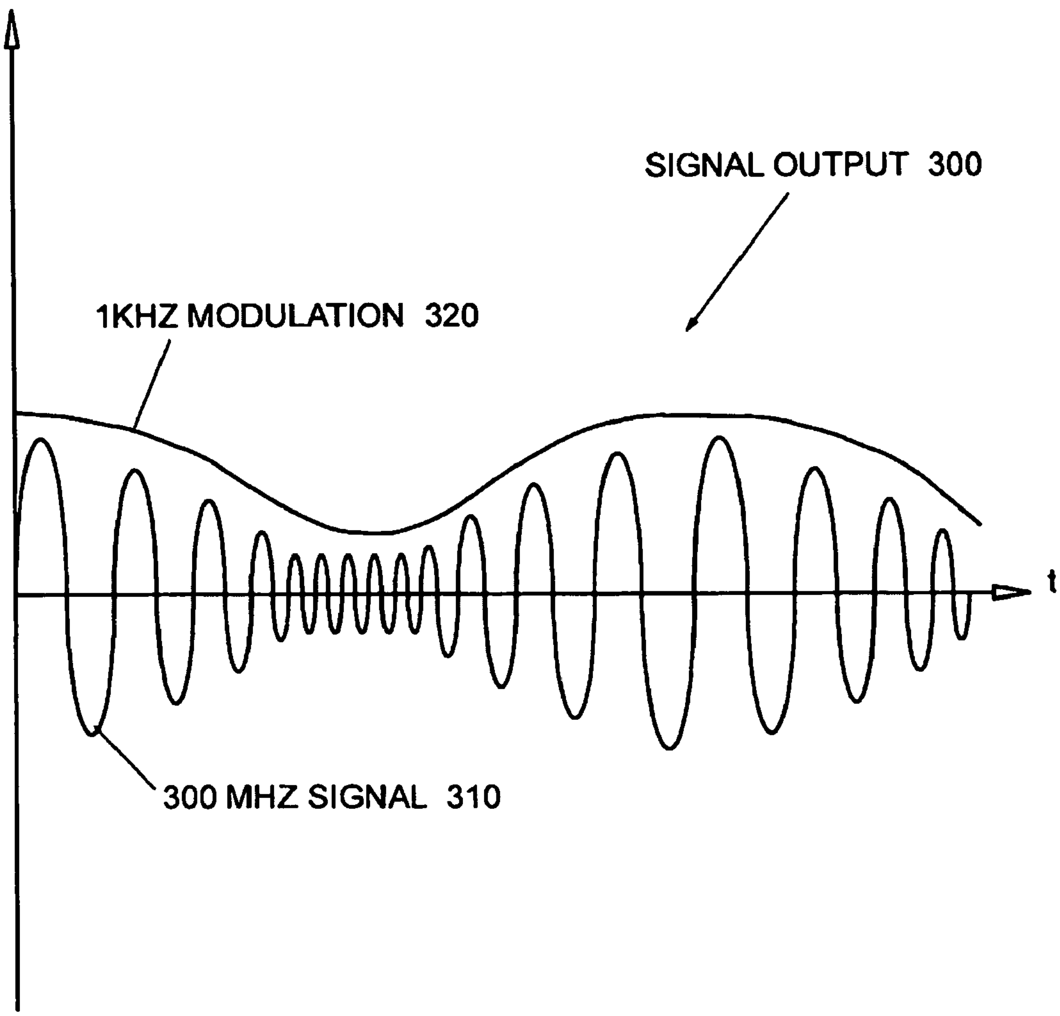
FIG. 3 is a plot of an amplitude-modulated probe signal that is used in combination with a lock-in amplifier to reduce the signal-to-noise ratio of the IV measurement made with the IV probe.

FIG. 3 illustrates an example voltage signal 300 applied by the high frequency RF voltage source 150 to the upper electrode of CC system 10 versus time. A 300 MHz signal 310 is amplitude modulated at, for example, 1 kHz within the envelope 320 shown in FIG. 3. The raw voltage and current signals output by the IV probe 140 are detected, as described above, through a lock-in amplifier 250 that isolates the signal at 1 KHz modulation 320, thus increasing the signal to noise ratio. Data acquisition unit 260 then receives the detected voltage and current signals and performs the subsequent calibration and determination of the complex impedance.

TABLE 1

Exemplary frequencies associated with the CC system and impedance Measurement system of the present invention

| | | |
|---|---|---|
| Upper Electrode Frequency | 27 MHz | 60 MHz |
| Lower Electrode Frequency | 2 MHz | 2 MHz |
| Probe Frequency | 150 MHz | 300 MHz |
| Modulation Frequency | 1 KHz | 1 KHz |

Table 1 illustrates two standard example sets of frequency values associated with CC system 10 and impedance measurement system 14. The first set of parameters (center column) utilizes an upper electrode frequency of 27 MHz, a lower electrode frequency of 2 MHz, and a probe signal frequency of 150 MHz with a modulation frequency of 1 KHz. The second set of parameters (right column) utilizes an upper electrode frequency of 60 MHz, lower electrode frequency of 2 MHz, probe signal frequency of 300 MHz with a modulation frequency of 1 KHz. The amplitude modulation (AM) is locked to the local oscillator frequency of (lock-in) amplifier 250 to obtain a large signal-to-noise ratio.

Method of Operation, First Embodiment

Figure 4:
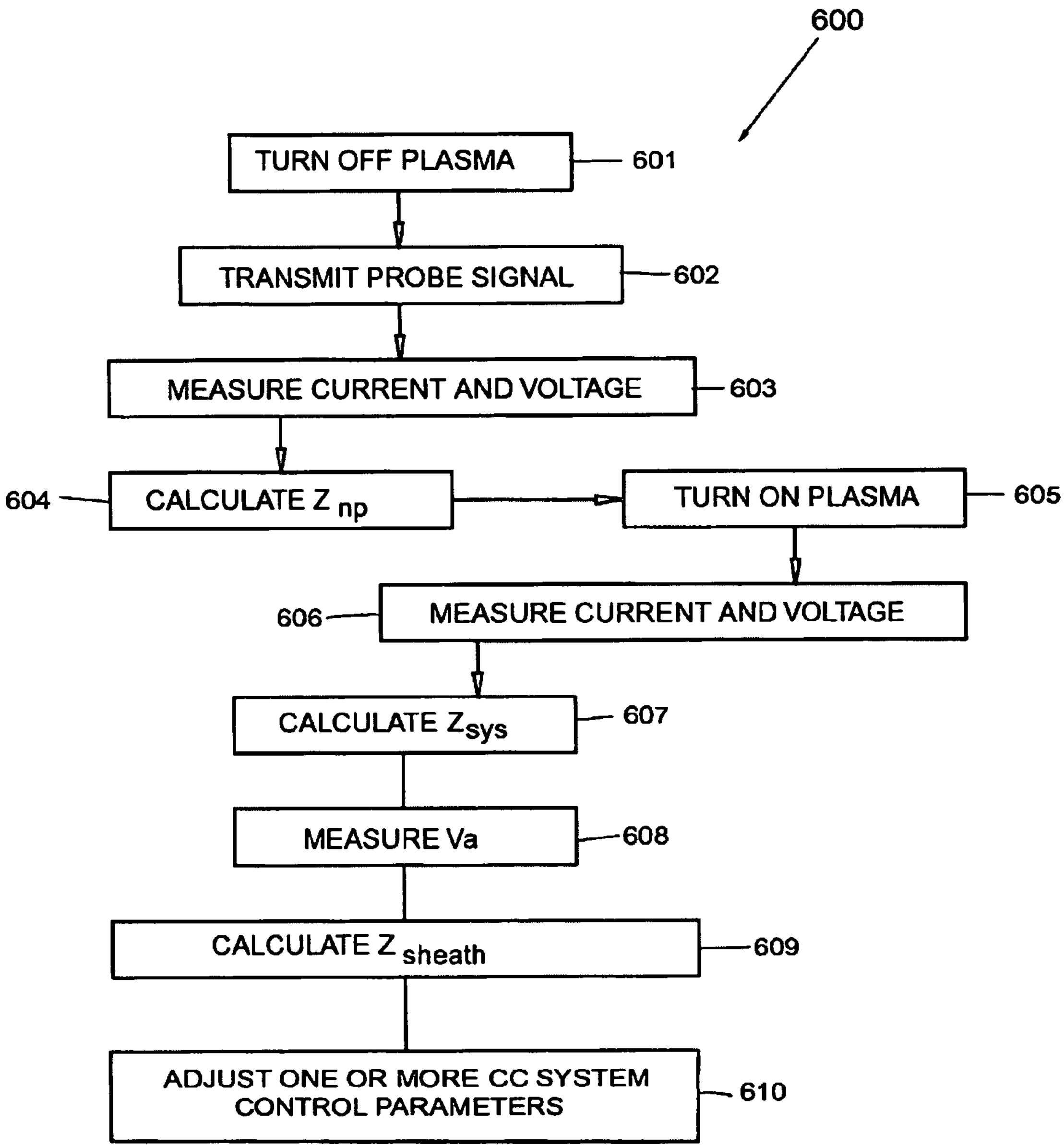
FIG. 4 is a flow diagram of the method steps for measuring the plasma impedance in a capacitively coupled plasma reactor according to a first embodiment of the present invention that utilizes a single-frequency probe signal.

With reference now to FIG. 4 and flow diagram 600 therein, and also to FIG. 1, a method of measuring the impedance of plasma 40 in CC system 10 using impedance measurement system 14 and single-frequency sampling according to a first embodiment of the present invention is now described. In this first embodiment, high-frequency RF source 150 need only be capable of generating a single frequency, e.g., 150 MHz or 300 MHz.

In the first step 601, upper electrode power source 66 is turned off so that there is no plasma 40 formed in space 60 between upper and lower electrodes 50 and 56. In the next step 602, a high-frequency (e.g., 150 MHz) signal is generated by high-frequency source 150 and transmitted to upper electrode 50 through IV probe 140 and high-pass filter 130.

Next, in step 603, the current (I) and the voltage (V) passing through to upper electrode 50 via line 160 are measured along line 160 using IV probe 140. The raw output voltage V and current signal I are passed to amplifier 250, amplified, and then passed along to and received by data acquisition unit 260, which stores and calibrates the information.

In the next step 604, the value for $Z_{np}$ is calculated from the measured voltage V and current I signals in computer 270 using the relation:

$$Z_{np}=\frac{|V|e^{j(\omega_m t+\phi_1)}}{|I|e^{j(\omega_m t+\phi_2)}}=|Z_{np}|e^{j\Delta\phi}=\mathrm{Re}\{Z_{np}\}+j\,\mathrm{Im}\{Z_{np}\}\approx\frac{1}{j\omega_m C}+R_c, \tag{4}$$

wherein $$C=\frac{\varepsilon A}{d}$$

(assuming negligible structure reactances), $j=\sqrt{-1}$, $\omega_m=2\pi f_m$, $R_c$ is the resistance of workpiece 100 and the upper and lower electrodes 50 and 56, A is the area of the upper electrode and d is spacing between the upper and lower electrodes. Once the impedance without plasma $Z_{np}$ is computed, it is stored in computer 270 for future use.

In the next step 605, plasma 40 is generated ("turned on") in space 60 by flowing gas into interior region 30 of chamber 20 and activating upper electrode power source 66 to provide RF power to upper electrode 50. Lower electrode RF power source 106 may also be activated to provide a bias. Then, in step 606, the current I and voltage V passing through line 160 and to the upper electrode 50 are measured using IV probe 140. The values for I and V measured in this step are passed to amplifier 250, amplified, and then passed along to and received by data acquisition unit 260, which stores and calibrates the information.

Next, in step 607, the system impedance $Z_{sys}$ is calculated in computer 270 using the relation $$\begin{aligned}Z_{sys}&=\frac{|V|e^{j(\omega_m t+\phi_1)}}{|I|e^{j(\omega_m t+\phi_2)}}\\&=|Z_{sys}|e^{j\Delta\phi}\\&=\mathrm{Re}\{Z_{sys}\}+j\,\mathrm{Im}\{Z_{sys}\}\approx\frac{1}{j\omega_m C_s}+j\omega_m L_p+R_p+R_c\end{aligned} \tag{5}$$

wherein $$C_s=\frac{\varepsilon A}{2d_s},$$

$d_s$ is the plasma sheath thickness, $j=\sqrt{-1}$, $\omega_m=3\pi f_m$, $L_p=\omega_p^{-2}C^{31\ 1}$ ($C=\epsilon A/d$, where d is the electrode spacing) is the plasma inductance, $\omega_p$ is the plasma frequency, $R_p=L_p\gamma$ is the plasma resistance, and $\gamma$ is the electron-neutral collision frequency. The remaining symbols are as defined above.

Next, in step 608, a third voltage measurement is acquired in order to provide information for the determination of the sheath impedance $Z_{sheath}$, given by $Z_{sheath}\sim 1/j\omega_m C_s$ wherein $C_s=\epsilon A/2d_s$, in step 609. Here, the sheath thickness $d_s$ is modeled using known techniques, such as the method as described in the text, *Principles of Plasma Discharges and Materials Processing*, Lieberman & Lichtenburg, John Wiley and Sons, 1994. Pp. 164–166, 327–386, or in the text, *Basic principles of the RF capacitive discharge*, Rajzer, Y. P., Shneider, M. N. & Yatsenko, N. A., CRC Press. Pp. 24–27, which portion of said text is incorporated herein by reference.

However, in many of the sheath models present in the literature, namely those listed above, an additional measurement of voltage amplitude or peak-to-peak voltage across the parallel plate electrodes is required. Using a VI probe 82 as described in FIGS. 1 and 2 and with reference to pending application No. 60/259,862, a voltage measurement is preferably made at the upper (and lower electrode if needed), and more specifically at a convenient location along the transmission stub through which RF power is transferred to the upper electrode as is shown in FIG. 1. The voltage measurement in step 608 comprises measuring the voltage amplitude at the fundamental RF frequency of the RF generator 66 in FIG. 1.

Then, in step 609, the sheath thickness $d_5$ and, hence, the sheath impedance is computed. However, in order to compute the sheath thickness knowledge of the electron density and the electron-neutral collision frequency are required a priori. For example, following the text in the latter reference, the sheath thickness may be represented as $$d_s^2\left[\left(\omega_m^2-\omega_{pe}^2\frac{2d_s}{d}\right)^2+\omega_m^2\gamma^2\right]=\left(\frac{eV_a}{md}\right)^2, \tag{6}$$

where d is the electrode spacing and $V_a$ is the electrode voltage amplitude at the fundamental RF frequency of RF generator 66 in FIG. 1. Inspection of equation (6) identifies three unknowns, namely, the sheath thickness $d_s$, electron density $n_e$ (or electron plasma frequency, $\omega_{pe}^2=(en_e/\epsilon_o m)$) and electron-neutral collision frequency $\gamma$. Therefore, in order to solve for the sheath thickness in equation (6), two additional equations are required.

Using the impedance measurements in steps 604 and 607, the real part and complex part of the plasma impedance $Z_{plasma}$ can be separately calculated via the following relations and serve the needs for two additional equations above; viz.

$$Re\{Z_{plasma}\}=Re\{Z_{sys}\}-Re\{Z_{np}\}\approx R_p. \tag{7a}$$

and $$Im\{Z_{plasma}\}=Im\{Z_{sys}\}-Im\{Z_{np}\}-Im\{Z_{sheath}\}\approx\omega_m L_p \tag{7b}$$

Furthermore, additional equations necessary to relate the plasma inductance $L_p$ and plasma resistance $R_p$ to the electron density and the electron-neutral collision frequency include $$L_p \approx \frac{1}{\omega_{pe}^2 C} \tag{8a}$$

and $$R_p \approx L_p \gamma, \tag{8b}$$

where both relations have been obtained from the text, *Principles of Plasma Discharges and Materials Processing*, Lieberman & Lichtenburg, John Wiley and Sons, 1994, pgs. 327–386.

Since three equations (i.e., sheath model equation (6), the real part of the plasma impedance described in equation (7a) and the complex part of the plasma impedance described in equation (7b)) are available for three unknown variables (i.e., sheath thickness $d_s$, electron density $n_e$ and electron-neutral collision frequency $\gamma$) equations (6), (7a) and (7b) can be written as a single equation solvable for the sheath thickness $d_s$, from which the remaining variables may be computed in step 610. Equations (6), (7a) and (7b) are then combined to obtain:

$$f(d_s) = d_s^2\left[\left(\omega_m^2 - \frac{\omega_m}{\left(\mathrm{Im}\{Z_{sys}\} - \mathrm{Im}\{Z_{np}\} + \frac{2d_s}{\varepsilon A\omega_m}\right)\frac{\varepsilon A}{d}}\frac{2d_s}{d}\right)^2 + \omega_m^4\frac{\left(\mathrm{Re}\{Z_{sys}\} - \mathrm{Re}\{Z_{np}\}\right)^2}{\left(\mathrm{Im}\{Z_{sys}\} - \mathrm{Im}\{Z_{np}\} + \frac{2d_s}{\varepsilon A\omega_m}\right)^2}\right] - \left(\frac{eV_a}{md}\right)^2 = 0 \tag{9}$$

wherein known values ($\epsilon$, d, A, e, m, $\omega_m$) and measured values ($\mathrm{Re}\{Z_{sys}\}$, $\mathrm{Im}\{Z_{sys}\}$, $\mathrm{Re}\{Z_{np}\}$, $\mathrm{Im}\{Z_{np}\}$, $V_a$) are substituted into equation (9). This forms a numerical expression $f(d_s)=0$ such that the function f is simply dependent on $d_s$. Equation (9) is a non-linear function of $d_s$ and, therefore, may be solved using the most suitable non-linear (root-finding) algorithm such as the Newton-Rhapson method or the Bisection method.

Lastly, in step 610, the equations for the plasma impedance $Z_{plasma}$ (7a & 7b) and the calculation of the sheath thickness $d_s$ are used to adjust, via computer control, one or more of the system control parameters while processing workpiece 100. For instance, the electron-neutral collision frequency may be derived as $$\gamma = \frac{\omega_m\left(\mathrm{Re}\{Z_{sys}\} - \mathrm{Re}\{Z_{np}\}\right)}{\mathrm{Im}\{Z_{sys}\} - \mathrm{Im}\{Z_{np}\} + \frac{2d_s}{\varepsilon A\omega_m}}, \tag{10a}$$

and the electron density may be determined as:

$$n_e = \frac{\varepsilon m}{e}\frac{\gamma}{\left(\mathrm{Re}\{Z_{sys}\} - \mathrm{Re}\{Z_{np}\}\right)\frac{\varepsilon A}{d}}, \tag{10b}$$

and these two parameters may serve to provide information on the plasma state useful for process control.

Method of Operation, Second Embodiment

In a second embodiment of the present invention, high-frequency RF source 150 is capable of generating signals at multiple frequencies, e.g., over a range from about 100 MHz to 300 MHz. In this second embodiment, a multiple frequency scanned probe signal is used to measure the system impedance more accurately than can be done with a single frequency probe signal. Particularly, the probe frequency can be scanned through the geometric resonance, at which the reactive impedance becomes vanishing small. Thus, measurement of the real part of the system impedance (i.e., the system resistance) is possible in this second embodiment.

Figure 5:
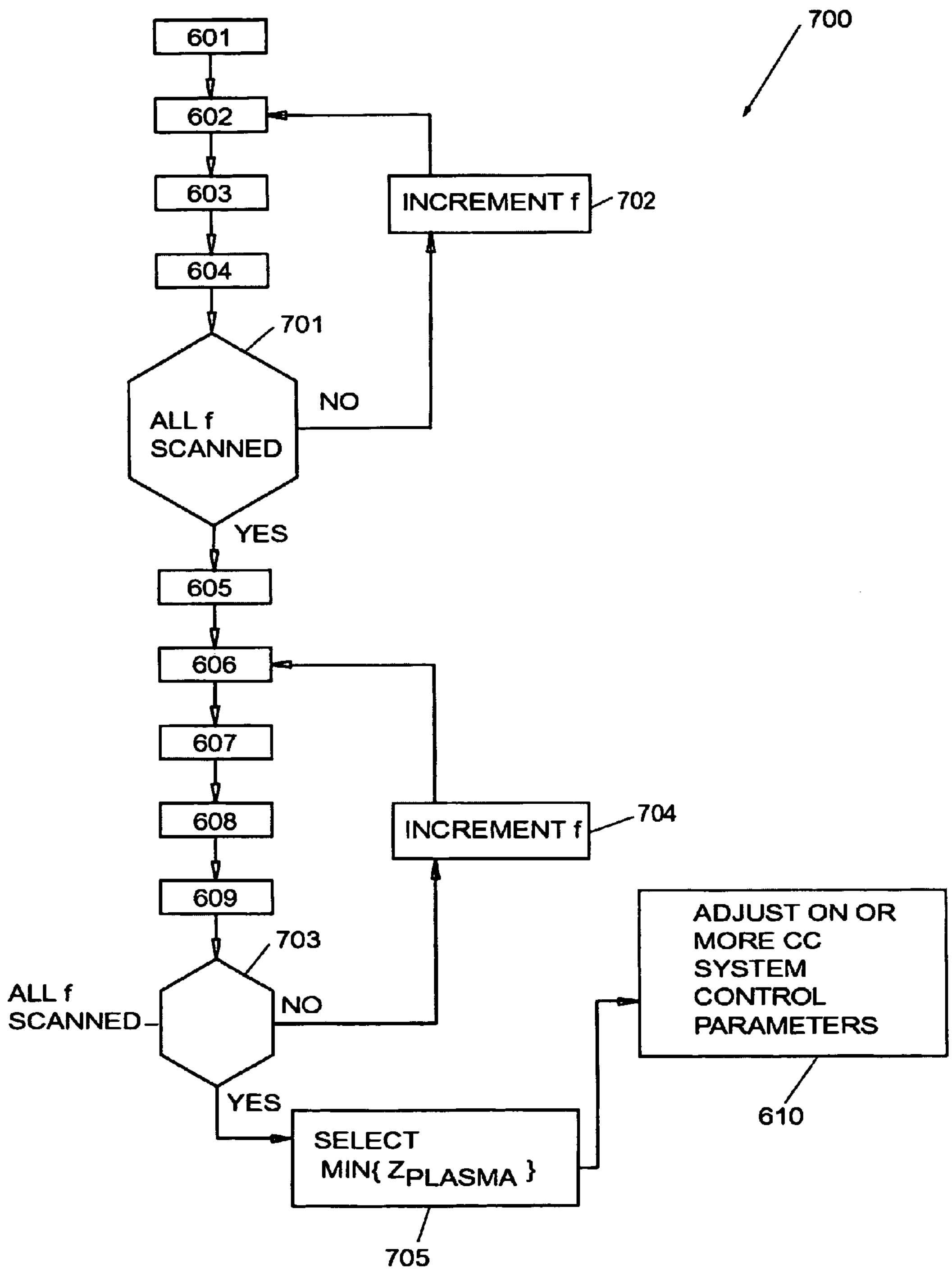
FIG. 5 is a flow diagram of the method steps for measuring the plasma impedance in a capacitively coupled plasma reactor according to a second embodiment of the present invention that utilizes a spectrum of frequencies for the probe signal.

With reference now to FIG. 5 and flow diagram 700 therein, and also again to FIG. 1, a method of measuring the impedance of plasma 40 in CC system 10 using impedance measurement system 14 and multiple-frequency sampling according to a second embodiment of the present invention is now described.

The first steps of the method are steps 601–604 as discussed above in connection with the first embodiment. The only difference is that steps 602–604 are performed for each of a number of probe frequencies over a spectrum of probe frequencies. Step 701 inquires whether all frequencies have been scanned. If not, then the probe frequency from high-frequency RF source 150 is incremented in step 702 and steps 602–604 are repeated. If all the desired probe frequencies have been scanned, then the method continues to step 605, as discussed above, which involves flowing gas into interior region 30 of chamber 20 and activating upper electrode RF power source to provide power to upper electrode 50 so as to form plasma 40 between upper and lower electrodes 50 and 56.

Next, steps 606–609, as described above, are used to calculate $Z_{plasma}$ for a particular probe frequency. Steps 606–609 are repeated for each probe frequency over the spectrum of probe frequencies. Step 703 inquires whether all frequencies have been scanned. If not, then the probe frequency from high-frequency RF source 150 is incremented in step 705 and steps 606–609 are repeated. If all the desired probe frequencies have been scanned, then the method continues to step 705, where the minimum impedance $Z_{plasma}$ from the impedance values at the various frequencies is ascertained. This is readily accomplished using computer 270. The minimum value of $Z_{plasma}$ determined in this manner represents the plasma impedance having a maximum real component.

Lastly, the method proceeds to step 610, wherein the information about the plasma impedance $Z_{plasma}$ is used to adjust, via computer control, one or more of the system control parameters while processing workpiece 100.

The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction and operation described herein. Accordingly, other embodiments are within the scope of the appended claims.

What is claimed is:

1. An apparatus for measuring impedance in a capacitively coupled plasma reactor system having an upper and lower electrode capable of forming a plasma therebetween when a plasma generating RF signal is coupled to at least one of the upper and lower electrodes, comprising:

a) a high-frequency RF source in electrical communication with the upper electrode and capable of generating an electrical probe signal having a higher frequency than said plasma generating RF signal;

b) a first high-pass filter arranged between the upper electrode and said high-frequency RF source, for passing high-frequency components of the electrical probe signal to said upper electrode and isolating said high frequency RF source from said plasma generating RF signal; and c) a current-voltage probe arranged between said high-frequency source and said high-pass filter, for measuring the current and voltage of the probe signal.

2. The apparatus as claimed in claim 1, further comprising:

an amplifier electrically connected to said current-voltage probe.

3. The apparatus as claimed in claim 2, further comprising:

a data acquisition unit electrically connected to said amplifier.

4. An apparatus according to claim 3, wherein said data acquisition unit is an analog-to-digital converter.

5. An apparatus according to claim 2, wherein said amplifier is a lock-in amplifier.

6. The apparatus as claimed in claim 1, further comprising:

a second high-pass filter electrically connected to the lower electrode and to ground.

7. An apparatus according to claim 1, wherein said high-frequency RF source and said current-voltage probe are connected by a coaxial line, and wherein said current-voltage probe is formed in said coaxial line.

8. An apparatus according to claim 1, wherein said high-frequency RF source is capable of generating electrical signals having different frequencies.

9. An apparatus according to claim 1, further comprising:

an upper electrode RF power source separate from the high-frequency RF source and configured to generate said plasma generating RF signal; and a frequency-specific path to ground, wherein the frequency-specific path to ground acts as a low impedance path to ground for the high-frequency components of the electrical probe signal but as a high impedance path to ground for power provided by the upper electrode RF power source.

10. An apparatus according to claim 1, further including a computer electrically connected to said data acquisition unit.

11. An apparatus according to claim 10, wherein said computer is also electrically connected to the capacitively coupled plasma reactor system.

12. An apparatus according to claim 1, wherein said first high-pass filter passes electrical signals having a frequency of at least 100 MHz.

13. A method for measuring the impedance in a capacitively coupled plasma processing system having an upper and lower electrode, comprising the steps of:

a) ensuring no plasma exists between the upper and lower electrodes and transmitting a high-frequency probe signal to the upper electrode through an electrical line connected thereto, said probe signal having a higher frequency than a plasma generating signal applied to said plasma processing system;

b) measuring, in said electrical line, a first current and a first voltage of the probe signal;

c) calculating a no-plasma-present impedance $Z_{np}$ from said first current and said first voltage;

d) forming a plasma between the upper and lower electrodes using said plasma generating signal; and e) calculating a system impedance $Z_{sys}$ in the presence of the plasma.

14. The method as claimed in claim 13, wherein the calculating step e) comprises measuring a second current and a second voltage of the probe signal passing to the upper electrode through said electrical line.

15. The method as claimed in claim 14, further comprising:

measuring a third voltage of the plasma generating signal passing to the upper electrode through said line.

16. The method as claimed in claim 15, further comprising:

determining a sheath thickness $d_s$ and sheath impedance $Z_{sheath}$.

17. The method as claimed in claim 16, further comprising:

calculating the plasma electron density $n_e$ and electron-neutral collision frequency $\gamma$.

18. A method according to claim 17, further comprising:

adjusting at least one control parameter of the plasma processing system based on the step of calculating the plasma electron density $n_e$ and the electron-neutral collision frequency $\gamma$.

19. A method according to claim 13, wherein said step b) includes the step of blocking low-frequency electrical signals transmitted from the upper electrode.

20. A method according to claim 13, wherein said step b), said measuring is performed using a current-voltage probe formed directly in said electrical line.

21. A method according to claim 13, further comprising:

electrically connecting a high-pass filter to the lower electrode and to ground.

22. A method according to claim 21, wherein said step b) further includes modulating said probe signal and detecting said probe signal with a lock-in amplifier tuned to said modulated probe signal.

23. A method according to claim 13, wherein said step b) further includes the step of transmitting said first current and said first voltage to a data acquisition unit and storing said first current and said first voltage therein.

24. A method according to claim 13, wherein said step b) includes the step of selecting the probe frequency to be between a harmonic of a fundamental RF frequency used to create the plasma.

25. A method according to claim 13, wherein said step h) includes modeling the sheath resistance.

26. A method according to claim 13, further comprising:

measuring the first current and the first voltage over a range of probe signal frequencies; and selecting a minimum value for the plasma impedance $Z_p$ in the range of the probe signal frequencies.

27. A method according to claim 26, further comprising:

adjusting at least one control parameter of the plasma processing system based on the step of selecting.

* * * * *